United States Patent [19]
Takamoto

[11] Patent Number: 5,617,044
[45] Date of Patent: Apr. 1, 1997

[54] COMPARATOR CIRCUIT

[75] Inventor: Masahiro Takamoto, Kanagawa-ken, Japan

[73] Assignee: Kabushiki Kaisha Toshiba, Kawasaki, Japan

[21] Appl. No.: 623,215

[22] Filed: Mar. 28, 1996

[30] Foreign Application Priority Data

Mar. 31, 1995 [JP] Japan ................................. 7-075911
Mar. 25, 1996 [JP] Japan ................................. 8-068273

[51] Int. Cl.⁶ .......................... H03K 5/153; H03K 5/22
[52] U.S. Cl. ................................. 327/77; 327/72
[58] Field of Search ......................... 327/403–405, 327/407, 408, 411, 545, 546, 72, 77, 337, 544

[56] References Cited

U.S. PATENT DOCUMENTS 5,075,688  12/1991  Hosotani et al. ..................... 327/94
5,165,058  11/1992  Nakatami et al. ..................... 327/63
5,357,150  10/1994  Jaquette ................................ 327/72
5,488,323   1/1996  Beacham, Jr. et al. ............... 327/74
5,488,449   1/1996  Joo ..................................... 327/72
5,543,794   8/1996  Kanzaki ............................... 327/77

Primary Examiner—Toan Tran
Attorney, Agent, or Firm—Oblon, Spivak, McClelland, Maier & Neustadt, P.C.

[57] ABSTRACT

A comparator circuit has a selection circuit for receiving an input signal, a reference signal, and a selection signal, for generating an inverted input signal which is made by inverting the input signal, for selecting the reference signal during a normal operation mode and selecting the inverted input signal during a test operation mode according to a level of the selection signal and a comparator section for receiving the reference signal or the inverted input signal selected by the selection circuit and for receiving the input signal, for comparing the selected signal and the received signal, and for transmitting a comparison result to outside of the comparator circuit.

23 Claims, 17 Drawing Sheets

5,617,044

COMPARATOR CIRCUIT

BACKGROUND OF THE INVENTION

1. Field of the Invention

The present invention relates to a comparator circuit of a various types, a static type, a dynamic type, a amplifier type and so on, which is capable of performing a test operation without using a reference signal which is usually compared with an input signal transmitted to the comparator circuit.

2. Description of the Prior Art

There is a conventional comparator circuit of a static type which is constructed by using Field Effect Transistors (FETs), as shown in FIG. 19.

In FIG. 19, the conventional comparator circuit has a configuration comprising a p-channel FET 102 for receiving an input signal which is transmitted from outside through an input terminal 101, a p-channel FET 104 for receiving a reference signal provided to a reference terminal 103, whose level is set as a fixed level between a high level and a low level of the input signal and which is compared to the level of the input signal, a p-channel FET 105 connected between a high voltage power source $V_{DD}$ and source terminals of the p-channel FETs 102 and 104 whose source terminals are commonly connected to each other, a n-channel FET 106 which is located between a drain terminal of the p-channel FET 102 and a ground GND, a n-channel FET 107 which is located between a drain terminal of the p-channel FET 104 and a ground GND and a gate terminal of the n-channel FET 107 is connected to the drain terminal of the p-channel FET 104 and the gate terminal of the n-channel FET 106, and an inverter circuit 109 which is connected between an output terminal 108 and the drain terminals of the p-channel FET 102 and the n-channel FET 106 which are commonly connected.

In the conventional comparator circuit having the configuration described above, there is a condition that the conventional comparator circuit receives the input signal the high level of which is 1.2 Volt and the low level is 0.4 volt, and the voltage level of the reference signal is 0.8 volt which is an intermediate voltage between the high level and the low level of the input signal, for example.

Under the condition described above, when the input signal of the high level is transmitted to the input terminal 101, the p-channel FET 102 approaches a non-continuity state or an OFF state, but not enters the non-continuity state where the voltage level between the drain and source of the p-channel FET 102, the n-channel FETs 106 and 107 enter a continuity state or an ON state where a current flows, and the level of the output signal provided to the output terminal 108 becomes the high level.

On the other hand, when the conventional comparator circuit receives the input signal of the low level through the input terminal 101, the p-channel FET 102 enters the continuity state and the n-channel transistors 106 and 107 enter the non-continuity state, and the level of the output signal provided to the output terminal 108 becomes the low level.

When a burn-in-test, which is one of tough and durable tests for testing durability of comparator circuits, to this conventional comparator is performed, the conventional comparator circuit is connected to a burn-in-test board where a burn-in-test device is incorporated, and then the burn-in-test device generates test signals and transmits the test signals to the conventional comparator circuit through the burn-in test board.

In the burn-in-test of such a manner, the burn-in test device has a limit that it can generate only two levels of the input signal to be provided to the comparator circuit, the high level and the low level which are different to each other. For this reason, when the comparator circuit as the conventional type one described above is tested, because the conventional comparator circuit requires three different levels, the high level and the low level of the input signal and the reference level of the reference signal, the burn-in-test board side must generate the reference signal of the reference level other than the high and low levels of the input signal.

FIG. 20 is a configuration diagram of a conventional comparator circuit of a dynamic type. In this case, like the case of the conventional comparator circuit of a static type as shown in FIG. 19, when the burn-in test operation is executed, signals of three levels such as a high level, a low level and a reference signal level must be generated by a burn-in test board side. Moreover, the burn-in test board transmits these signals of the three levels to the comparator circuit during the test operation.

In addition, FIG. 21 is a configuration diagram of a conventional comparator circuit of an amplifier type. In this case, like the case of the conventional comparator circuit of a static type as shown in FIG. 19, when the burn-in test operation is executed, signals of three levels such as a high level, a low level and a reference signal level must also be generated by a burn-in test board side. Then, the burn-in test board transmits the signals of these three levels to the comparator circuit during the test operation.

In general, because many commercially available burn-in-test boards have no function for generating any signal having the reference level other than the high level and the low level of the input signal, these available burn-in test boards can not be used for the burn-in test of the conventional comparator circuit. Therefore an exclusive burn-in test board must be used for the burn-in-test of the conventional comparator circuit.

As described above in detail, in the conventional comparator circuit using three different levels of the signals, when the many commercially available burn-in-test boards is used for the burn-in test, it must be required to use the exclusive burn-in test board which is capable of generating the signals to be required for and used in the comparator circuit during the test operation mode. For this reason, it takes a lot of time and costs more to make the exclusive burn-in test board. This is a problem.

SUMMARY OF THE INVENTION

The present invention is invented in order to overcome the problem or the drawback included in the conventional comparator circuits described above.

It is an object of the present invention to provide a comparator circuit which is capable of performing a normal operation by using two signals of two different levels, the high level and the low level and which is capable of performing a test operation for testing the function of the comparator circuit with a commercially available test board without any exclusive test board.

It is another object of the present invention to provide a comparator circuit which is capable of reducing a fluctuate range of a threshold voltage at the input side of the comparator circuit after a test operation mode is completed.

In order to achieve the object of the present invention described above, the present invention provides a comparator circuit comprising: a selection circuit for receiving an input signal, a reference signal, and a selection signal, for generating an inverted input signal which is made by inverting the input signal, for selecting the reference signal during a normal operation mode and selecting the inverted input signal during a test operation mode according to a level of the selection signal; and a comparator section for receiving the reference signal or the inverted input signal selected by the selection circuit and for receiving the input signal, for comparing the selected signal and the received signal, and for transmitting a comparison result to outside of the comparator circuit.

As another preferred embodiment of the present invention, the comparator circuit described above further comprises a selection signal generation circuit for receiving the reference signal during the normal operation mode and for generating the selection signal indicating that the selection circuit selects the reference signal, and for receiving a test signal of a high level or a low level during the test operation mode and for generating the selection signal indicating that the selection circuit selects the inverted input signal.

As another preferred embodiment of the present invention, the present invention provides a comparator circuit comprising: a first selection circuit for receiving an input signal, a reference signal, and a selection signal, for selecting the reference signal during a normal operation mode, and for selecting the input signal during a test operation mode according to a level of the selection signal; a comparator section for receiving the input signal and the input signal or the reference signal selected by the first selection circuit, for comparing the received input signal and the selected signal, and for transmitting a comparison result; and a second selection circuit for receiving the comparison result from the comparator section and the input signal, and for selecting the comparison result during the normal operation mode and for selecting the input signal during the test operation mode according to the level of the selection signal.

Moreover, as another preferred embodiment of the present invention, the comparator circuit described above further comprises a selection signal generation circuit for receiving the reference signal during the normal operation mode and for generating the selection signal indicating that the second selection circuit selects the reference signal, and for receiving a test signal of a high level or a low level during the test operation mode and for generating the selection signal indicating that the second selection circuit selects the inverted input signal.

In addition, as another preferred embodiment of the present invention, in the comparator circuit described above, the comparator section comprises Field Effect Transistors (FETs) which are connected to each other based on a configuration of a differential amplifier type.

Furthermore, as another preferred embodiment of the present invention, in the comparator circuit described above, the selection signal is generated at outside of the comparator circuit, the comparator circuit further comprises a test terminal for receiving the selection signal generated at outside of the comparator circuit.

Further, as another preferred embodiment of the present invention, in the comparator circuit described above, the selection circuit comprises only a clocked inverter, or comprises a clocked inverter and a transfer gate, or comprises a transfer gate and an inverter.

Moreover, as another preferred embodiment of the present invention, in the comparator circuit described above, the first selection circuit comprises a clocked inverter, a transfer gate, and an inverter, or comprises a clocked inverter and an inverter, or comprises transfer gates and an inverter.

In addition, as another preferred embodiment of the present invention, in the comparator circuit described above, the second selection circuit comprises clocked inserters and inverters, or comprises a transfer gate, clocked inverters and inverters.

Moreover, as another preferred embodiment of the present invention, in the comparator circuit described above, the comparator section is a comparator section of a chopper type comprising a transfer gate and an inverter which are connected in parallel.

Furthermore, as another preferred embodiment of the present invention, in the comparator circuit described above, the comparator section is a comparator section of an amplifier type comprising an amplifier.

Further, as another preferred embodiment of the present invention, a comparator circuit comprises: an input signal terminal for receiving an input signal; a reference signal terminal for receiving a reference signal; and a comparator section of a chopper type comprising a transfer gate and an inverter which are connected in parallel, for receiving the input signal and the reference signal, based on the level of the reference signal for providing the input signal or for comparing the level of the input signal with the level of the reference signal and providing a comparison result to outside of the comparator circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Other features of this invention will become apparent in the course of the following description of exemplary embodiments which are given for illustration of the invention and are not intended to be limiting thereof.

Preferred embodiments of the present invention will be explained with reference to the accompanying drawings.

Figure 1:
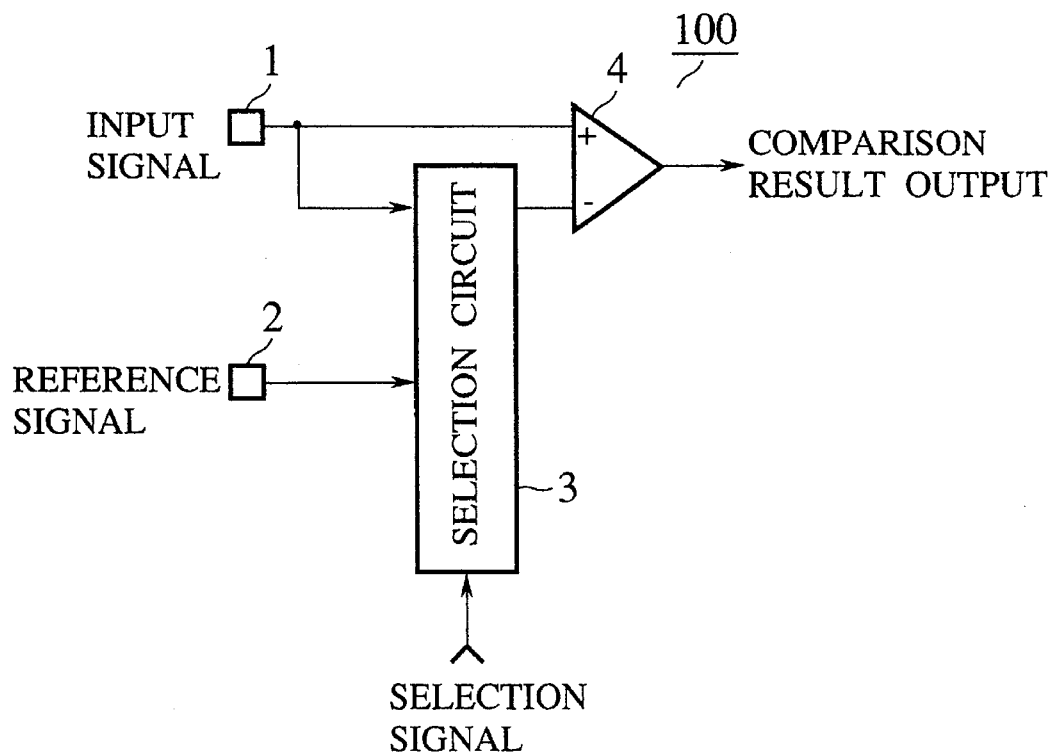
FIG. 1 is a diagram showing a configuration of a comparator circuit of a static type as the first embodiment of the present invention.

FIG. 1 is a diagram showing a configuration of a comparator circuit as the first embodiment (embodiment 1) of the present invention.

In FIG. 1, the comparator circuit 100 has a configuration comprising a selection circuit 3 and a comparator section 4.

The selection circuit 3 receives an input signal provided to an input terminal 1 and a reference signal transmitted to a reference terminal 2 and generates the inverted input signal which is obtained by inverting the input signal. The selection circuit 3 also selects the reference signal whose level is a fixed level between an amplitude range of the input signal according to the value of a selection signal during a normal operation mode and the selection circuit 3 selects the inverted input signal during a test operation mode such as a burn-in test mode, for example.

The comparator section 4 receives either the reference signal or the inverted input signal selected by the selection circuit 3 and the input signal through the input terminal 1, and then the comparator circuit and comparing them and generating a comparison result and transmits the comparison result to outside of the comparator circuit 100.

Figure 2A:
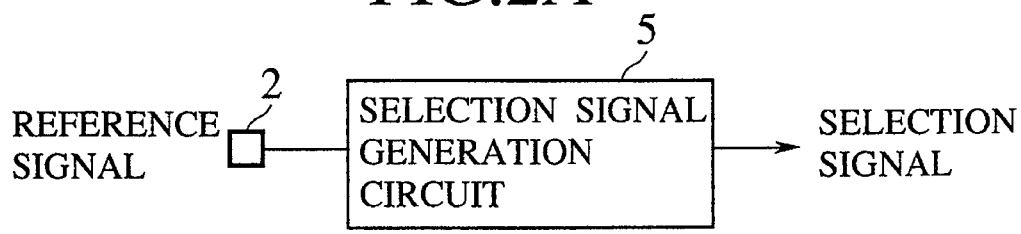
FIGS. 2A–2B are diagrams showing a configuration of a selection signal generation circuit for generating selection signals to be used for the comparator circuit as shown in FIG. 1.
Figure 2B:

FIG. 2 is a diagram showing a configuration of a selection signal generation circuit 5 for generating selection signals to be used for the comparator circuit as shown in FIG. 1.

As shown in the upper side designated by the reference character (a) in FIG. 2, the selection signal generation circuit 5 receives the reference signal and generates the selection signals and transmits the generated selection signals to the selection circuit 3. It can be acceptable to receive the selection signals through a test terminal 6 and transmits the received selection signals to the selection circuit 3 as shown in the lower side designated by the reference character (b) in FIG. 2. In this case, the selection signals are generated by other means. This test terminal is made only for receiving the selection signals.

The selection signal generation circuit 5 receives the reference signal during the normal operation mode and generates the selection signals indicating to select the reference signal. On the other hand, during the test operation mode, the selection signal generation circuit 5 receives the test signal whose level is either the high level or the low level through the reference terminal 2 and transmits this selection signal indicating to select the input signal.

By the way, in the comparator circuit 100, during the normal operation mode, having the configuration as shown in FIG. 1, the reference signal is provided to the reference terminal 2 and this reference signal is selected based on the value of the selection signal by the selection circuit 3 which receives the selection signal from the selection signal generation circuit 5 or from the test terminal 6. The selected reference signal is transmitted to the comparator section 4 from the selection circuit 3. The comparator section 4 compares the reference signal and the input signal provided through the input terminal 1 and provides a comparison output signal having the level corresponding to the comparison result to outside.

On the other hand, during the burn-in-test operation mode, the reference signal of either the high level or the low level is provided to the reference terminal 2 and the input signal of either the high level or the low level transmitted to the input terminal 1 based on the selection signal generated by the selection signal generation circuit 5 or provided to the test terminal 6 is selected and then inverted. The inverted input signal and the input signal (which is not inverted) provided to the input terminal 1 are transmitted to the comparator section 4. The comparator section 4 compares them and provides the comparison output signal having the level corresponding to the comparison result to outside.

This way, in the comparator circuit 100 as the embodiment 1 of the present invention, because the inverted input signal which is obtained by inverting the input signal as one of input signals of the comparator section 4 is provides to the comparator section 4 in the burn-in-test operation mode, the comparator section 4 can be performed. In addition, only the level of the output signal can be adjusted or changed based on the level of the input signal. Accordingly, in the comparator 100 of the embodiment 1 described above, it is not required to provide the reference signal to the comparator circuit 100, the level of the reference signal is the intermediate level of the high level and the low level of the input signal, from outside of the comparator circuit 100 during the burn-in-test operation mode. In other words, the comparator circuit 100 of the embodiment 1 can perform only by using the input signal of either the high level or the low level and the test signal of either the high level or the low level provided through the reference terminal 2. Thereby, the burn-in-test operation of the comparator circuit can be performed by using a commercially available burn-in-test board without using of any exclusive burn-in-test board. Therefore, by using the comparator circuit of the present invention, it does not take a lot of time and costs more to make the exclusive burn-in test board. In addition, because the comparator circuit of the present invention can be performed by selecting the input signal instead of the reference signal, it can be easily and simply made to execute the burn-in-test operation of the comparator circuit. Moreover, it is not required to provide a special terminal for receiving a test signal indicating the commence of the burn-in-test operation, so that the number of the terminals can be reduced when the selection signal is made from the reference signal during the burn-in-test operation. On the other hand, it is not required to incorporate the selection signal generation circuit, so that the entire of the configuration of the comparator circuit of the present invention can be reduced when the selection signal is received from outside through the test terminal 6 during the burn-in-test operation.

Figure 3:
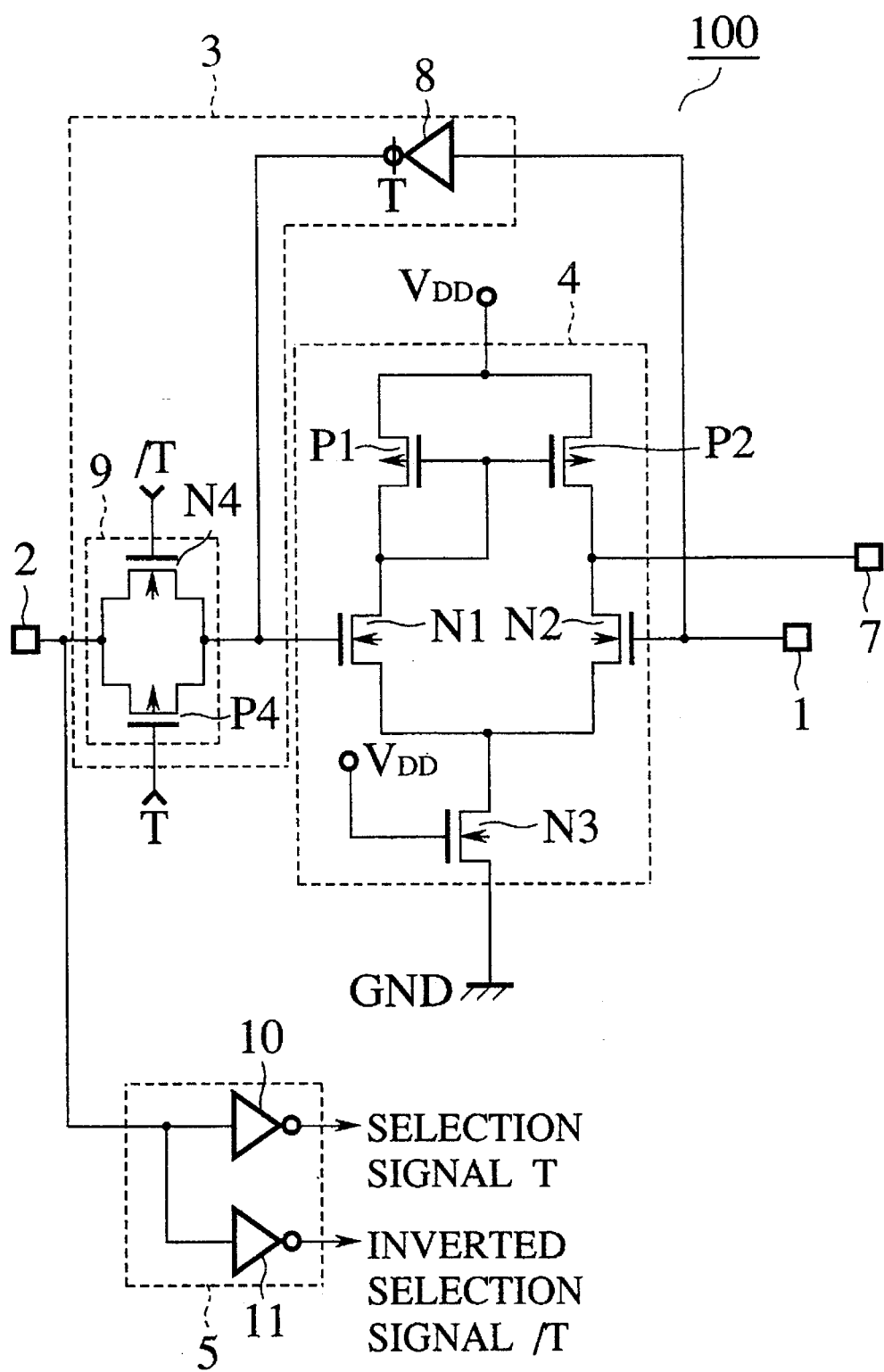
FIG. 3 is a diagram showing a concrete configuration of the comparator circuit as shown in FIGS. 1 and 2.
Figure 4:
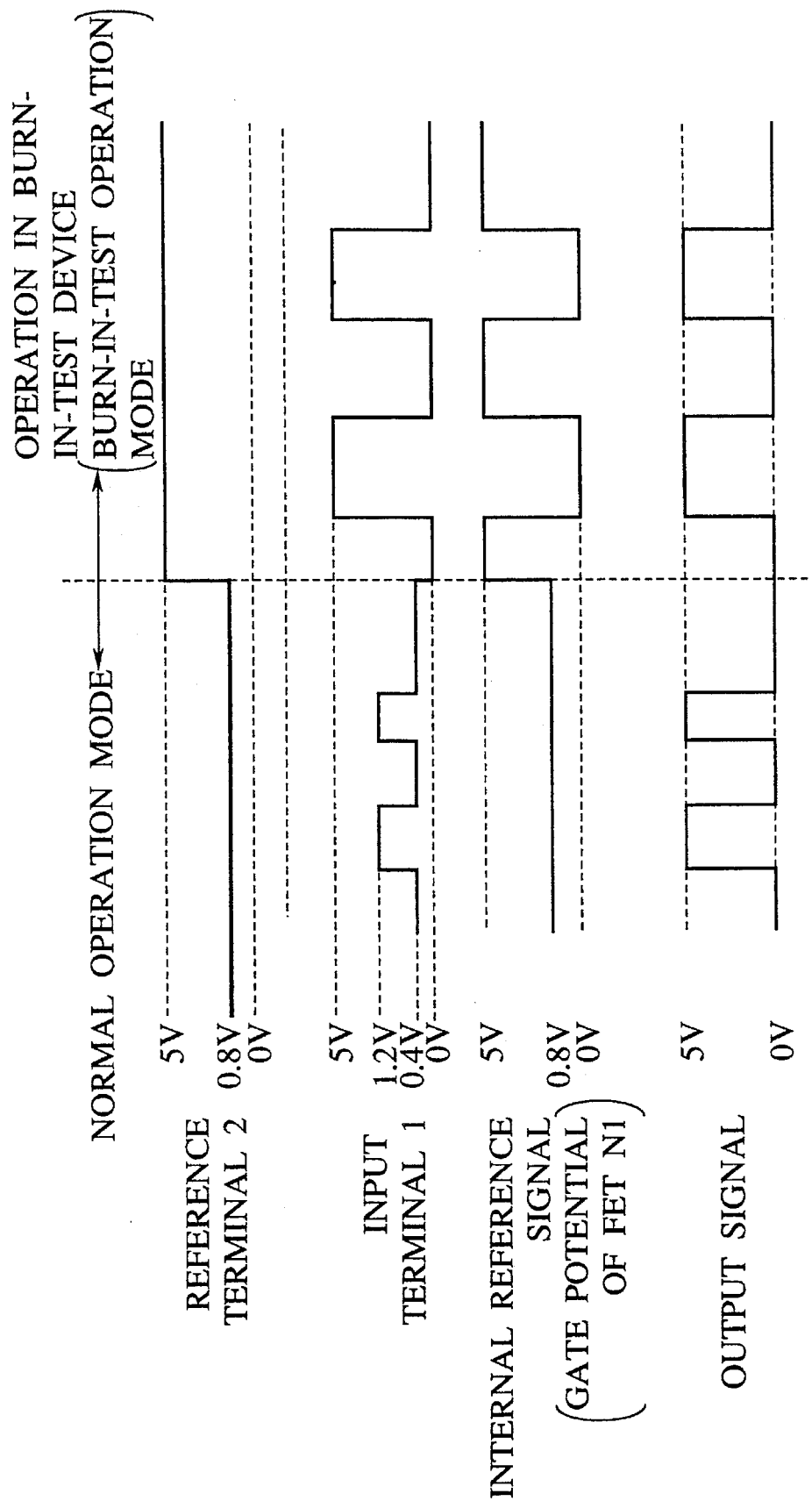
FIG. 4 is a timing chart showing an operation of the comparator circuit as shown in FIG. 3.

FIG. 3 is a diagram showing a concrete configuration of the comparator circuit as shown in FIGS. 1 and 2. FIG. 4 is a timing chart showing an operation of the comparator circuit as shown in FIG. 3.

In the comparator circuit 100 of the embodiment 1 as shown in FIG. 3, the comparator section 4 has a configuration of a differential amplifier type comprising a p-channel FET P1 whose gate terminal and the drain terminal are connected to each other and whose source terminal is connected to the high voltage power source $V_{DD}$, a p-channel FET P2 whose gate terminal is connected to the gate terminal of the p-channel FET P1 and whose source terminal is connected to the high voltage power source $V_{DD}$, a n-channel FET N1 whose drain terminal is connected to the gate terminals of the p-channel FET P1 and P2, a n-channel FET N2 whose gate terminal is connected to the input terminal 1 and whose drain terminal is connected to the drain terminal of the p-channel FET P2 and the output terminal 7 and whose source terminal is connected to the source terminal of the n-channel FET N1, and a n-channel FET N3 whose gate terminal is connected to the high voltage power source $V_{DD}$ and whose drain terminal is connected to the source terminals of the n-channel FETs N1 and N2 which are commonly connected to each other and whose source terminal is connected to the ground potential GND. The selection circuit 3 comprises a clocked inverter 8, a p-channel FET P4 and a n-channel FET N4. The operation of the clocked inverter 8 is controlled by the selection signal T, the input terminal of the clocked inverter 8 is connected to the input terminal 1 of the comparator circuit 100 and the output terminal of the clocked inverter 8 is connected to the gate terminal of the n-channel FET N1. The operation of the p-channel FET P4 is controlled by the selection signal T. The operation of the n-channel FET N4 is controlled by the inverted selection signal /T obtained by inverting the selection signal T. The p-channel FET P4 and the n-channel FET N4 make up a transfer gate 9. In the transfer gate 9, the n-channel FET N4 and the p-channel FET are connected in parallel. The selection circuit 5 comprises a buffer 10 and an inverter 11. The buffer 10 receives either the reference signal supplied through the reference terminal 2 or the selection signal of the high level or the low level provided through the test terminal 6 and generates the selection signal T of the low level during the normal operation mode and the selection signal T of the high level during the burn-in-test operation mode. The inverter 11 receives either the reference signal provided through the reference terminal 2 or the selection signal of the high level or the low level provided to the test terminal 6, and generates the inverted selection signal /T of the high level during the normal operation mode and the inverted selection signal /T of the low level during the burn-in-test operation mode.

In the comparator circuit 100 having the configuration described above, for example, we set the following condition that the high voltage power source $V_{DD}$ used in the entire of the comparator circuit is 5.0 volts, the ground voltage GND is 0 volt, the high level and the low level of the input signal provided to the input terminal 1 are 1.2 and 0.4 volts respectively during the normal operation mode, and the level of the reference signal is 0.8 volts. In addition, during the burn-in-test operation mode, the comparator section 4 receives the high level of 5.0 volts and the low level of 0 volt.

Under the condition described above, in the normal operation mode, as shown in the timing chart of FIG. 4, the reference signal of the 0.8 volts is provided to the reference terminal 2. Thereby, the selection signal T of the low level is transmitted form the buffer circuit 10 and the selection signal /T of the high level is provided from the inverter circuit 11. Then, the clocked inverter circuit 8 enters the OFF state (or non-continuity state) and the transfer circuit 9 enters the ON state (or continuity state). Accordingly, the reference signal is transmitted to the gate terminal of the n-channel FET N1 in the comparator section 4 as an internal reference signal through the transfer gate 9. Then, this internal reference signal and the input signal are compared by the comparator section 4. As shown in FIG. 4, the output signal of the comparison result whose timing is synchronized to the timing of the input signal is provided from the output terminal 7 during the normal operation mode.

Next, while the comparator circuit enters the burn-in-test operation mode, the test signal of the high level 5.0 volts is provided to the reference terminal 2 from a burn-in test board (not shown). Thereby, the buffer 10 generates the selection signal T of the high level, and the inverter circuit 11 generates the selection signal /T of the low level. At this time, the clocked inverter circuit 8 enters the ON state and the transfer gate 9 enters the OFF state (non-continuity state). Therefore the input signal provided to the input terminal 1 is transmitted to the gate terminal of the n-channel FET N2 in the comparator section 4 and this input signal is inverted by the clocked inverter 8 and the inverted input signal is transmitted to the gate terminal of the n-channel FET N1 in the comparator section 4 as the internal reference signal.

Specifically, when the input signal of the high level is provided to the input terminal 1, the internal reference signal of the low level is transmitted to the gate terminal of the n-channel FET N1. On the other hand, when the input signal of the low level is provided to the input terminal 1, the internal reference signal of the high level is given into the gate terminal of the n-channel FET N1. Thereby, as shown in the timing chart of FIG. 4, the signal of the reverse phase is provided to the input side of the comparator section 4, and then it is compared and the output signal whose level is corresponding to the input signal is transmitted to outside through the output terminal 7 in synchronization with the input signal. Accordingly, the comparator section 4 in the comparator circuit 100 of the present invention can be performed by using the input signal of the high level 5.0 volts and the low level 0 volt and the test signal of the 5.0 volts provided through the reference terminal 2.

As described above in detail, the burn-in-test operation for the comparator circuit of the present invention can be executed by using signals of two level such as the high level and the low level. Because it is only required to provide the signal of the high level through the reference terminal 2 and only to change the level of the input signal provided through the input terminal for executing the burn-in-test operation, the burn-in-test operation for the comparator circuit can be executed simply and easily.

In addition, the level of the test signal provided to the reference terminal 2 during the burn-in-test operation is not fixed, in other words, the level of the test signal is acceptable, both the high level and the low level. In this case, the levels of the selection signal T and the inverted selection signal /T can be obtained by changing and adjusting the threshold voltage value of each FET forming the selection circuit 5 including the buffer 10 and the inverter 11. Furthermore, it can be acceptable that the clocked inverter 8 is operated or enters the ON state by the selection signal T of the low level and the transfer gate 9 is executed or enters the ON state by the selection signal T of the low level and the inverted selection signal /T of the low level. In this case, the test signal of the low level is provided to the reference terminal 2 during the burn-in-test operation mode. This is a designed choice in circuit designers.

Embodiment 2

Next, the comparator circuit 200 of the second embodiment of the present invention will be explained.

Figure 5:
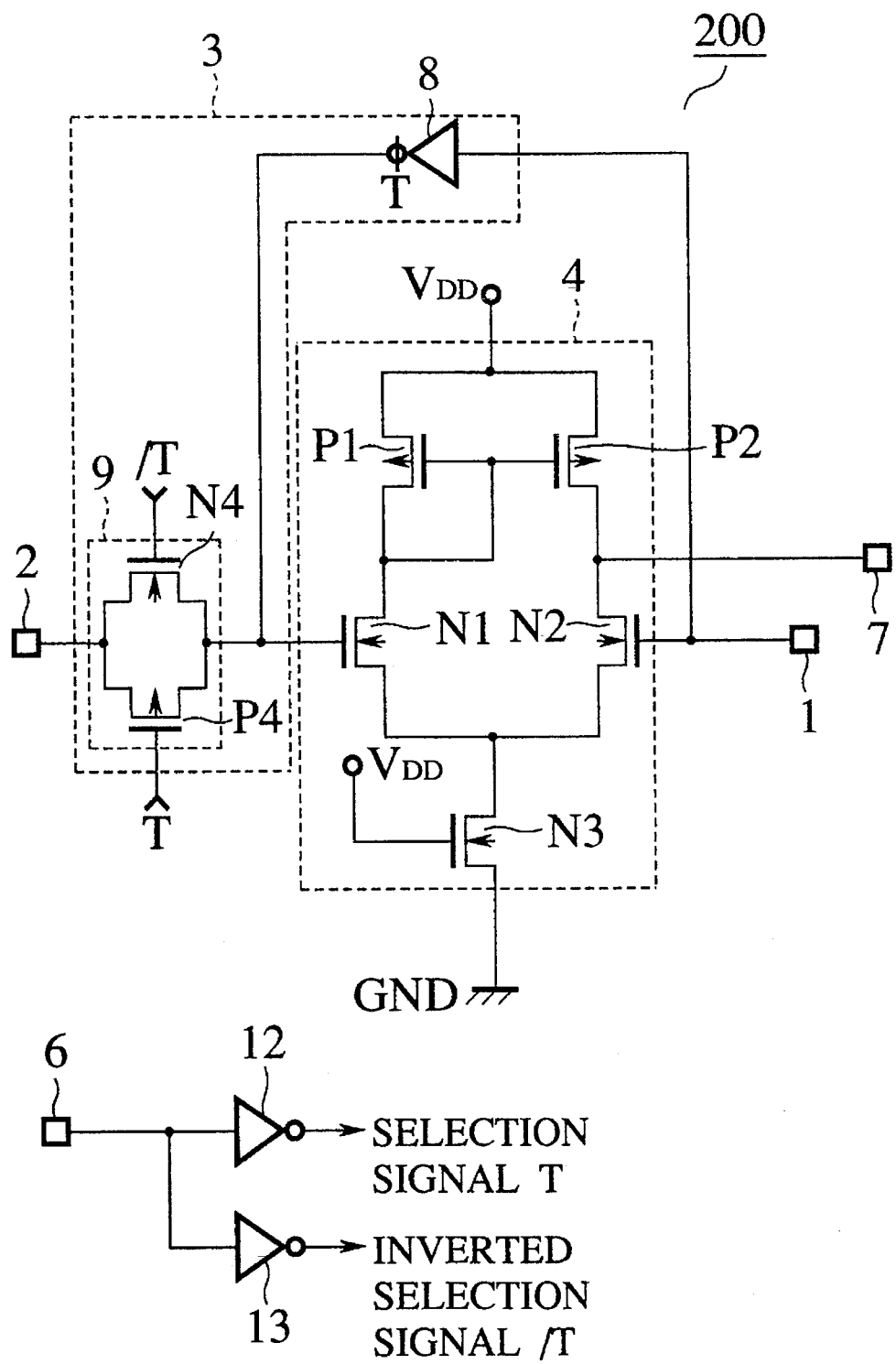
FIG. 5 is a diagram showing a configuration of a comparator circuit of a static type as the second embodiment of the present invention and which also shows another concrete configuration of the comparator circuit as shown in FIG. 1.

FIG. 5 is a diagram showing a configuration of the comparator circuit 200 as the second embodiment of the present invention and which also shows another concrete configuration of the comparator circuit as shown in FIG. 1.

The feature of the comparator circuit 200 as shown in FIG. 5 is that the test terminal 6 is added to the comparator circuit 100 having the configuration as shown in FIG. 3. The selection signal generated by means other than the comparator circuit 200 is transmitted to the test terminal 6. When the selection signal is provided to the test terminal 6, a buffer 12 generates the selection signal T and an inverter 13 also generates the inverted selection signal /T. Other components and operations of the comparator circuit 200 are same as those of the comparator circuit 100 as shown in FIG. 3.

Embodiment 3

Next, the comparator circuit 300 of the third embodiment (embodiment 3) of the present invention will be explained.

Figure 6:
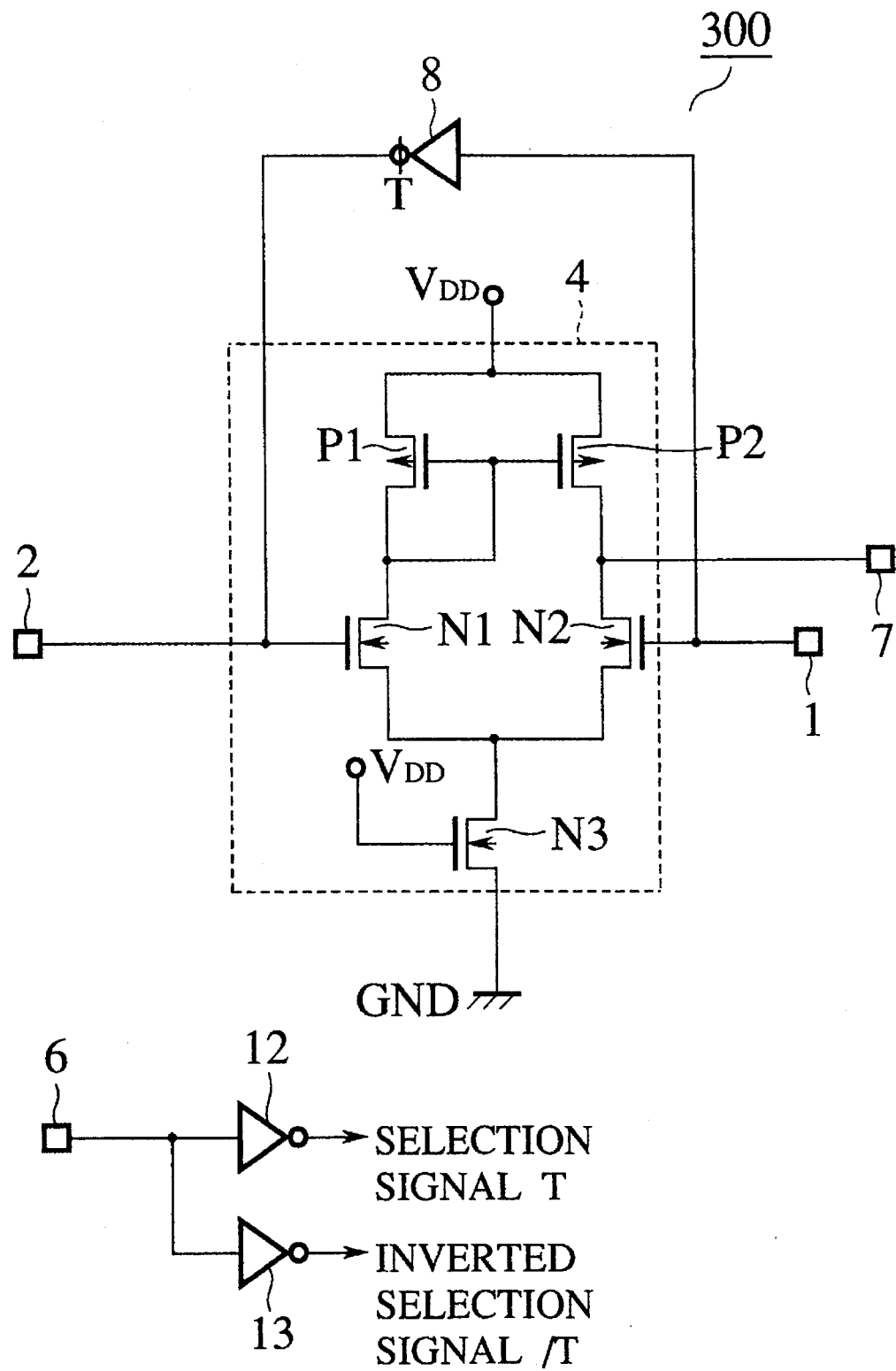
FIG. 6 is a diagram showing a configuration of a comparator circuit of a static type as the third embodiment of the present invention and which also shows another concrete configuration of the comparator circuit as shown in FIG. 1.

FIG. 6 is a diagram showing a configuration of a comparator circuit 300 as the third embodiment of the present invention and which also shows another concrete configuration of the comparator circuit 100 as shown in FIG. 1.

The feature of the comparator circuit 300 as shown in FIG. 6 is that the comparator circuit 300 of the embodiment 3 has no transfer gate 9 incorporated in the comparator circuit 200 of the embodiment 2 shown in FIG. 5. In addition, in the comparator circuit 300, the reference terminal 2 is connected to the gate terminal of the n-channel FET N1 in the comparator section 4. In this case, the burn-in-test operation for the comparator circuit 300 of the embodiment 3 is executed under the condition that the reference terminal 2 enters an open state. Other configuration and the operation of the comparator circuit 300 of the embodiment 3 is same as those of the comparator circuit 200 of the embodiment 2.

By using the configuration of the comparator circuit 300 of the embodiment 3, the configuration of the comparator 300 can be simple than that of the comparator circuit 200 of the embodiment 2 as shown in FIG. 5.

Embodiment 4

Next, the comparator circuit 400 of the fourth embodiment (embodiment 4) of the present invention will be explained.

Figure 7:
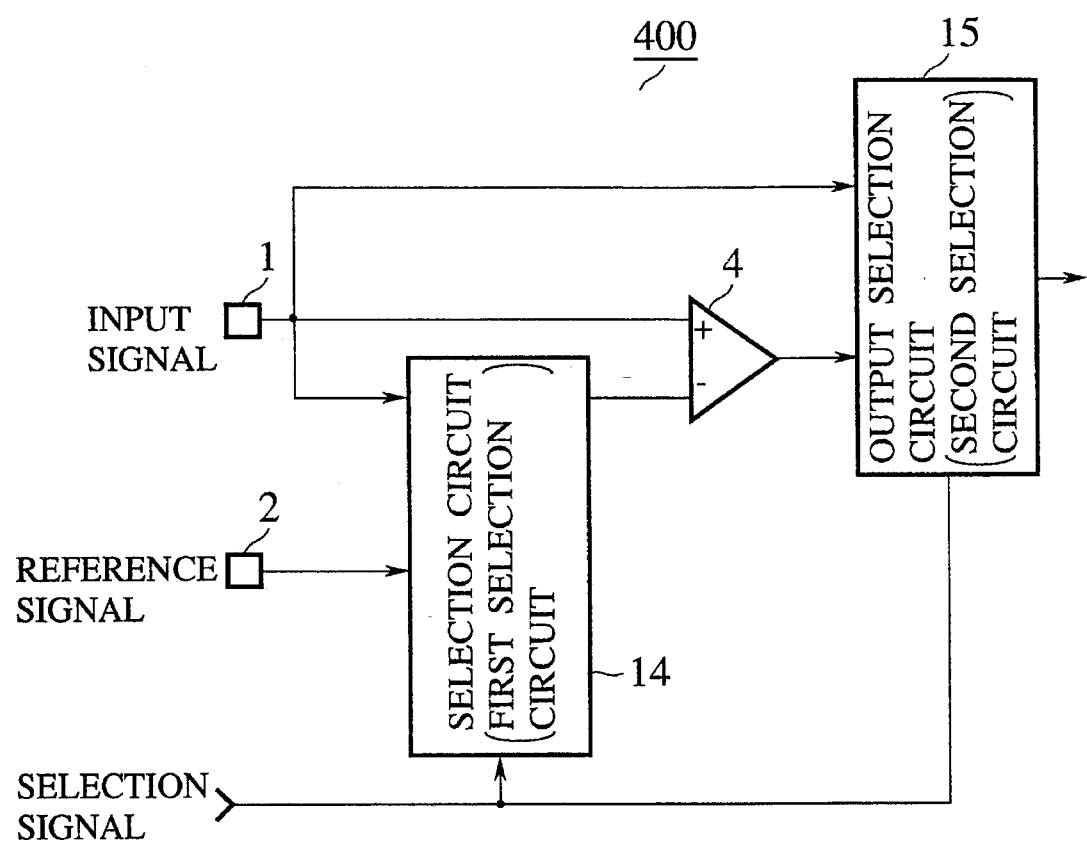
FIG. 7 is a diagram showing a configuration of a comparator circuit of a static type as the fourth embodiment of the present invention.

FIG. 7 is a diagram showing a configuration of the comparator circuit 400 as the fourth embodiment of the present invention.

In FIG. 7, the comparator circuit 400 of the embodiment 4 has the configuration comprising a selection circuit 14 (a first selection circuit), the comparator section 4, and the output selection circuit 15 (a second selection circuit). The selection circuit 14 selects the reference signal provided to the reference terminal 2 according to the selection signal during the normal operation mode, and selects the input signal which is not inverted provided to the input terminal 1 during the burn-in-test signal, and transmits the selected reference signal or the selected input signal to one of input terminals of the comparator section 4. The output selection circuit 15 selects the comparison result of the comparator section 4 during the normal operation mode, selects the input signal provided to the input terminal 1 during the burn-in-test operation mode, and transmits either the selected comparison result or the selected input signal to outside of the comparator circuit as the output of the comparator section 4.

The selection signal provided to the selection circuit 14 and the output selection circuit 15 used in the comparator circuit 400 of the embodiment 4 is same as that of the comparator circuit 100 as shown in FIGS. 1 and 2.

The comparator circuit 400 of the embodiment 4 as shown in FIG. 7 performs during the normal operation mode like the comparator circuit 100 of the embodiment 1 as shown in FIG. 1.

On the other hand, during the burn-in-test operation mode, the comparator section 4 enters the ON state (or enters the continuity state) by transmitting the input signal to both of the input terminals of the comparator section 4. Further, because the signals of the same voltage level are provided to both the input terminals of the comparator section 4, the input signal is selected by the output selection circuit 15 and the selected input signal becomes the output of the comparator circuit 400.

In the comparator circuit 400 having the configuration and the operation of the embodiment described above, during the burn-in-test operation, because both of the input terminals of the comparator section 4 receive the input signals whose phase are same to each other, the fluctuation or the change of the threshold voltage of the FETs which are the differential inputs in the comparator section 4 become same, so that it can be achieved to eliminate the difference of both FETs threshold voltages, as compared to the configuration of the comparator circuit 100 of the embodiment 1 as shown in FIG. 1 in which the comparator section 4 receives different phase input signals. Thereby, there is no harmful effects of heating for the comparator circuit 400 and the compactor circuit 400 can be executed normally during the normal operation mode even if the burn-in-test operation is performed.

By the way, even if the comparator circuit has the configuration of the embodiment 1 as shown in FIG. 1, during the burn-in-test operation mode, it can give the same effect of the embodiment 4 when the input signal whose period of the high level and the low level are same as that of the embodiment 4 is provided to the input terminal 1 in order to give the same load to both of the FETs which become the differential inputs in the comparator section 4.

Figure 8:
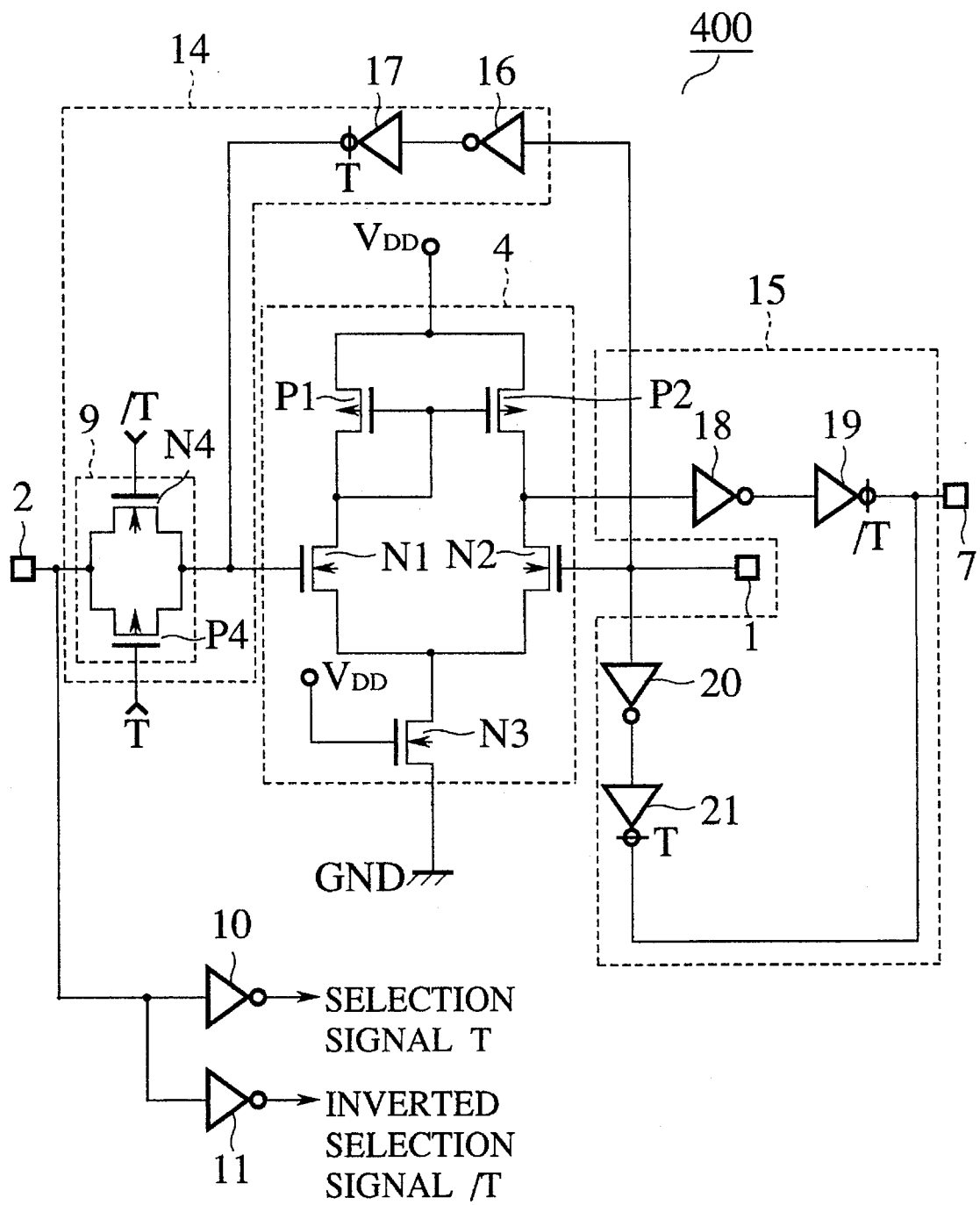
FIG. 8 is a diagram showing a concrete configuration of the comparator circuit of the fourth embodiment as shown in FIG. 7.

FIG. 8 is a diagram showing a concrete configuration of the comparator circuit 400 of the fourth embodiment as shown in FIG. 7.

The configuration of the comparator circuit 400 of the embodiment 4 shown in FIG. 8 is basically same as that of the configurations of the embodiments as shown in FIGS. 3, 5, and 6. In addition, the selection signal generation circuit 5 in the embodiment 4 is also same as that of the embodiments as shown in FIGS. 3, 5, and 6.

Specifically, the comparator section 4 in the embodiment 4 shown in FIG. 8 is same as that of the embodiments shown in FIGS. 3, 5, and 6.

In the comparator circuit 400 shown in FIG. 8, like the selection circuit 3 of the embodiments shown in FIGS. 3, 5, and 8 basically, the selection circuit 14 comprises the transfer gate 9, and the inverter 16 and the clocked inverter 17 which are connected in series and placed between the input terminal 1 and the gate terminal of the n-channel FET N1 in the comparator circuit 4. The output selection circuit 15 comprises an inverter 18 and a clocked inverter 19 which are incorporated between the output terminal 7 of the comparator circuit and the drain terminals (which are commonly connected to each other) of the p-channel FET P2 and the c-channel FET N2 in the comparator section 4, and an inverter 20 and a clocked inverter 21 which are connected in series and placed between the input terminal 1 and the output terminal 7.

In the configuration of the comparator circuit 400 of the embodiment 4 as shown in FIG. 8, the signal to be provided to the reference terminal 2 and the generation timing of the selection signals T and /T are same as that of the case of the embodiments shown in FIGS. 3, 5, and 6 in level and timing. Accordingly, during the normal operation mode, the transfer gate 9 and the clocked inverter 19 enter the ON state (or enter the continuity state) and the clocked inserters 17 and 21 enter the OFF state (or enter the non-continuity state). In this situation, during the normal operation mode, the comparison result executed by the comparator section 4 is transmitted to the output terminal 7 through the inverter 18 and the clocked inverter 19.

On the other hand, during the burn-in-test operation mode, the transfer gate 9 and the clocked inverter 19 enter the OFF state (or enter the non-continuity state) and the clocked inverter 19, and the clocked inserters 17 and 21 enter the ON state (or enter the continuity state). In this situation, during the burn-in-test operation mode, the input signal is provided to the gate terminal of the n-channel FET N2 as one of the input terminals of the comparator section 4 and the input signal is also transmitted to the gate terminal of the n-channel FET N2 as the other input terminal of the comparator section 4 through the inverter 16 and the clocked inverter 17. In addition, the input signal is given to the output terminal 7 through the inverter 20 and the clocked inverter 21. In this situation, the burn-in-test operation mode is performed.

Embodiment 5

Next, the comparator circuit 500 of the fifth embodiment (embodiment 5) of the present invention will be explained.

Figure 9:
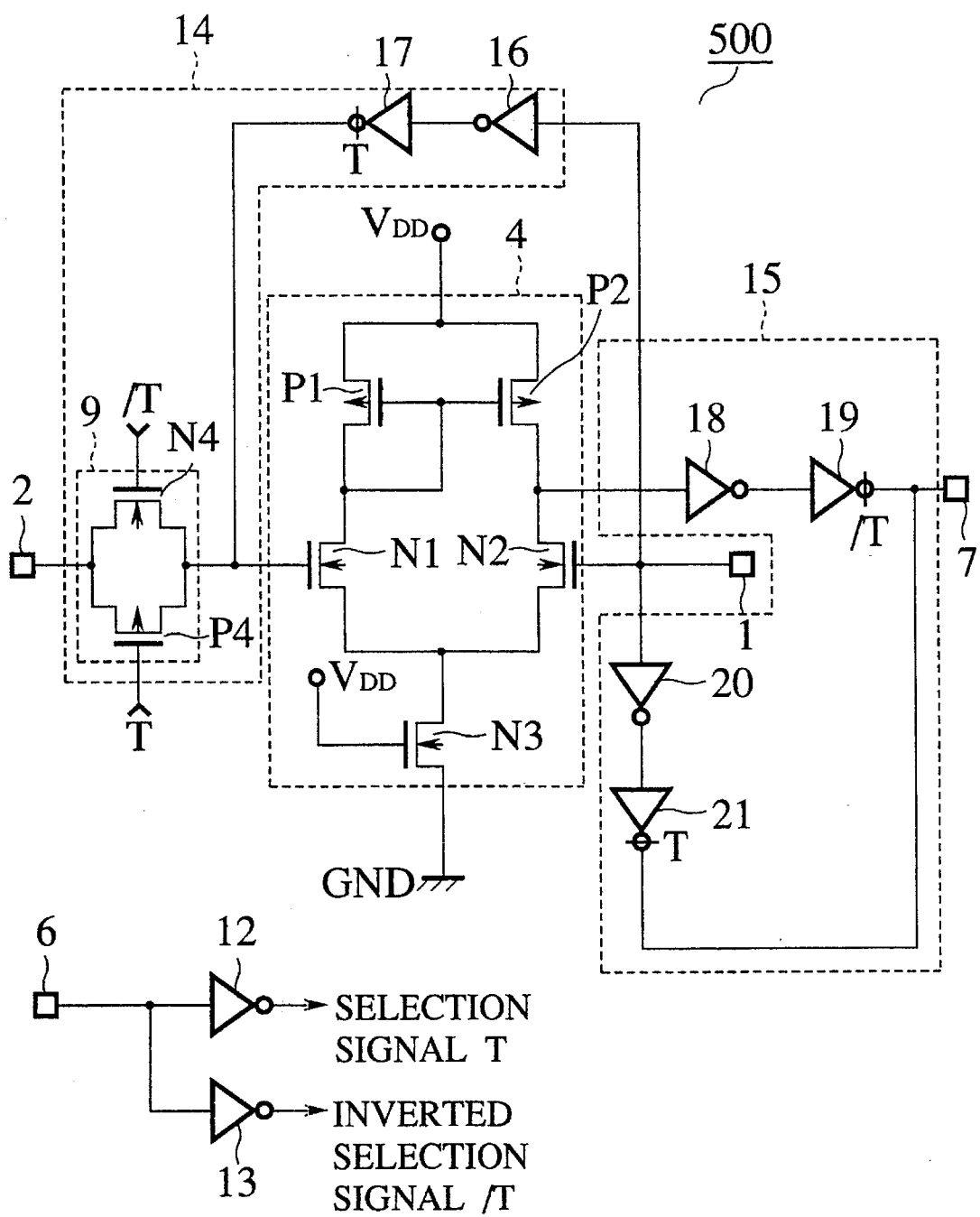
FIG. 9 is a diagram showing a configuration of a comparator circuit of a static type as the fifth embodiment of the present invention and which also shows another concrete configuration of the comparator circuit as shown in FIG. 7.

FIG. 9 is a diagram showing a configuration of the comparator circuit 500 as the embodiment 5 of the present invention and which also shows another concrete configuration of the comparator circuit 400 of the embodiment 4 as shown in FIG. 7. Specifically, in the comparator circuit 500 shown in FIG. 9, the configuration of the selection signal generation circuit 5 generating the selection signal is same as that of the embodiment shown in FIGS. 3, 5, and 6.

The comparator circuit 500 of the embodiment 5 shown in FIG. 9 comprises specially-used test terminal 6 used for the burn-in-test operation in addition to the configuration of the comparator circuit 400 shown in FIG. 8. The test signal generated by outside device is given to the test terminal 6 and the selection signal T is generated by the buffer 12, an the inverted selection signal /T is also generated by the clocked inverter 13. Other components and the operations are same as those of the embodiment shown in FIG. 8.

Embodiment 6

Next, the comparator circuit 600 of the sixth embodiment (embodiment 6) of the present invention will be explained.

Figure 10:
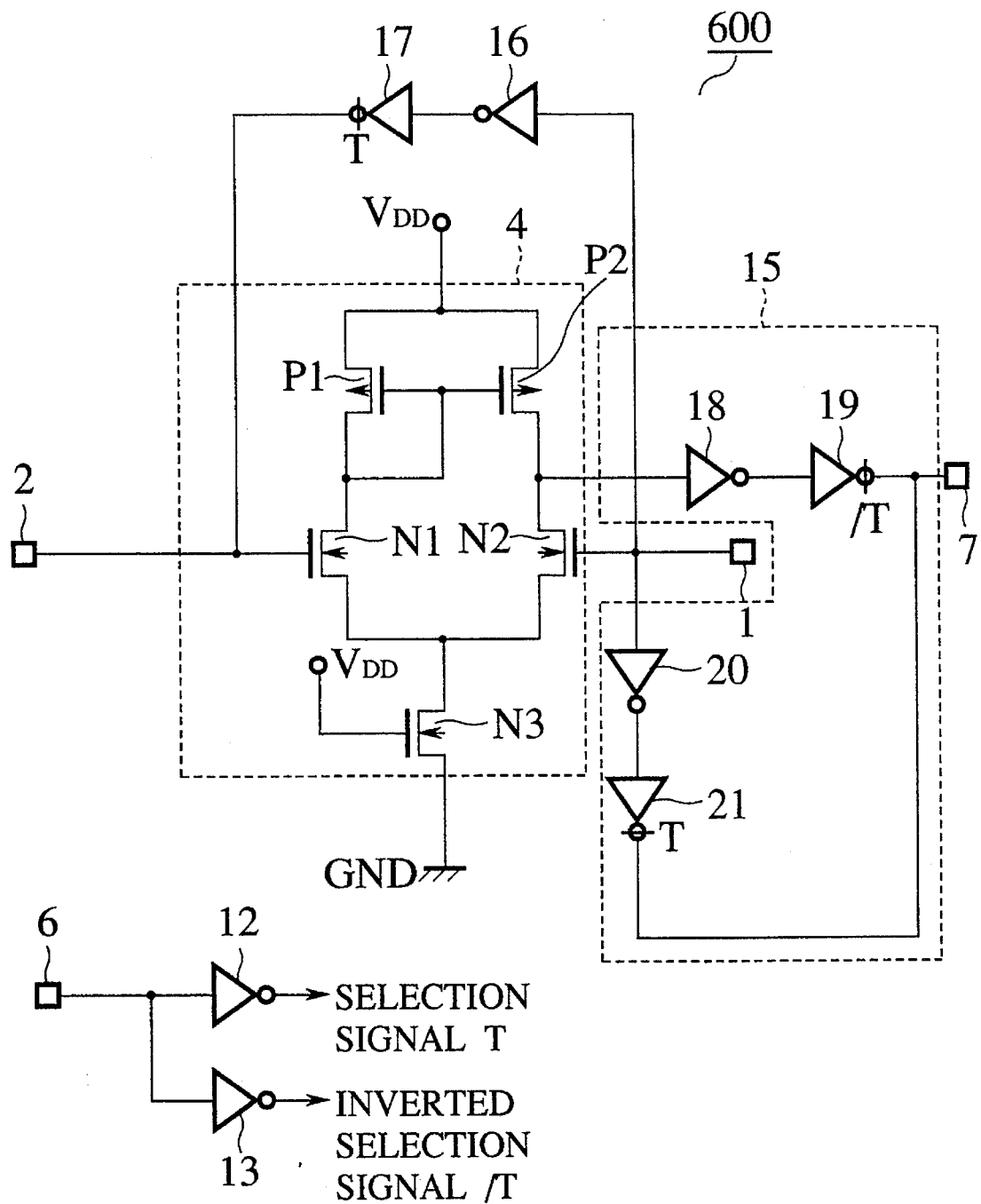
FIG. 10 is a diagram showing a configuration of a comparator circuit of a static type as the sixth embodiment of the present invention and which also shows another concrete configuration of the comparator circuit as shown in FIG. 7.

FIG. 10 is a diagram showing a configuration of the comparator circuit 600 as the embodiment 6 of the present invention and which also shows another concrete configuration of the comparator circuit 400 of the embodiment 4 as shown in FIG. 7. Specifically, in the comparator circuit 600 shown in FIG. 10, the configuration of the selection signal generation circuit 5 generating the selection signal is same as that of the embodiment shown in FIGS. 3, 5, and 6.

As compared with the configuration of the comparator circuit 500 of the embodiment 5 shown in FIG. 9, the transfer gate 9 is eliminated and the gate terminal of the n-channel FET N1 used in the comparator section 4 is directly connected to the reference terminal 2, so that the burn-in-test operation can be performed under the condition that the reference terminal 2 enters the open state (in which any signal is not provided to the reference terminal 2). Other components of this embodiment 5 shown in FIG. 9 are same as those of the embodiments shown in FIGS. 3, 5, and 6.

The comparator circuit 600 of the embodiment 6 shown in FIG. 10 can be made more simply than that of the embodiment 5 shown in FIG. 9.

Figure 11:
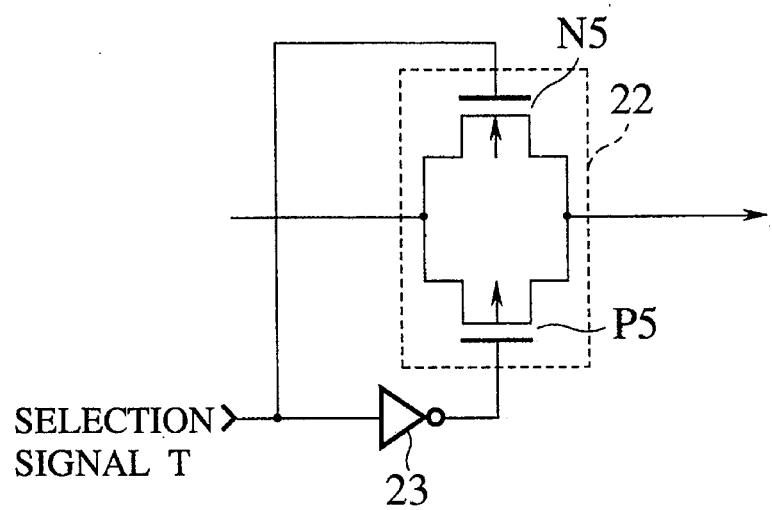
FIG. 11 is a diagram showing a configuration of a constituent element which can be replaced with a constituent element incorporated in the comparator sections as shown in FIGS. 3, 5, 6 and FIGS. 8–10.

FIG. 11 is a diagram showing a configuration of a constituent element which can be replaced with a constituent element incorporated in the comparators as shown in FIGS. 3, 5, 6 and FIGS. 8–10.

As shown in FIG. 11, it can be acceptable to replace the clocked inverter 8 in the embodiments shown in FIGS. 3, 5, and 6 with a circuit comprises a transfer gate 22 having a n-channel FET N5 which enters the ON state (or enters the continuity state) by the selection signal T and a p-channel FET P5 which enters the ON state (or enters the continuity state) by the inverted selection signal /T which are connected in parallel and an inverter 23 generating the inverted selection signal /T. In this configuration of the circuit, an inverter is placed between the input side and the output side of the transfer gate 22.

In addition, it can be also acceptable to replace the clocked inverter 17 used in the embodiments shown in FIGS. 8 to 10 with the circuit comprising the transfer gate 22 and the inverter 23 which are connected in series shown in FIG. 11. In this case, the inverter 16 connected between the input terminal of the transfer gate 22 and the input terminal 1 can be neglected.

Figure 12:
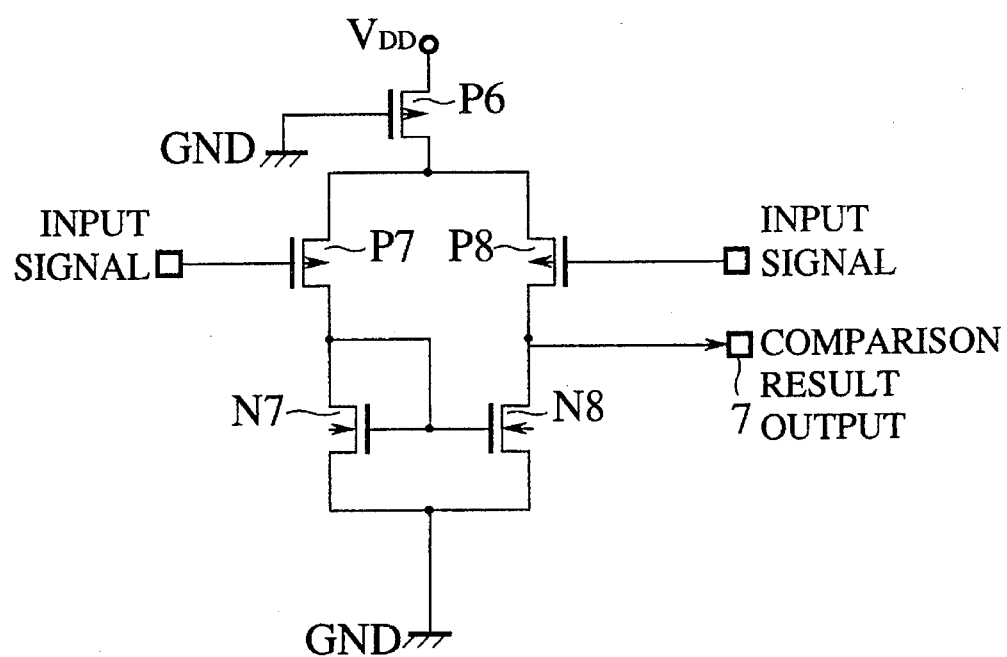
FIG. 12 is a diagram showing a configuration of a comparator circuit which can be replaced with the comparator circuit incorporated in each of the embodiments as shown in FIGS. 3, 5, 6 and FIGS. 8–10.

FIG. 12 is a diagram showing a configuration of a comparator circuit which can be replaced with the comparator circuit incorporated in each of the embodiments as shown in FIGS. 3, 5, 6 and FIGS. 8–10.

In the comparator circuits of the embodiments shown in FIGS. 1 and 7, it can also be acceptable to replace the comparator section 4 having the configurations shown in FIGS. 8 to 10 with the circuit having the configuration of a differential amplifier type shown in FIG. 12. This circuit shown in FIG. 12 comprises a p-channel FET P6 whose gate terminal is connected to the ground potential GND and whose source terminal is connected to the high voltage power source $V_{DD}$, a p-channel FET P7 whose gate terminal is connected to one of input terminals and whose source terminal is connected to the drain terminal of the p-channel FET P6, a p-channel FET P8 whose gate terminal is connected to other input terminal and whose source terminal is connected to the drain terminal of the p-channel FET P6, a n-channel FET N7 whose gate and source terminals are commonly connected and whose source terminal is connected to the ground potential GND, and a n-channel FET N8 whose gate terminal is connected to the gate terminal of the n-channel FET N7 and whose drain terminal is connected to the drain terminal of the p-channel FET P8 and whose source terminal is connected to the ground potential GND.

Embodiment 7

Next, the comparator circuit 700 of the seventh embodiment (embodiment 7) of the present invention will be explained.

Figure 13:
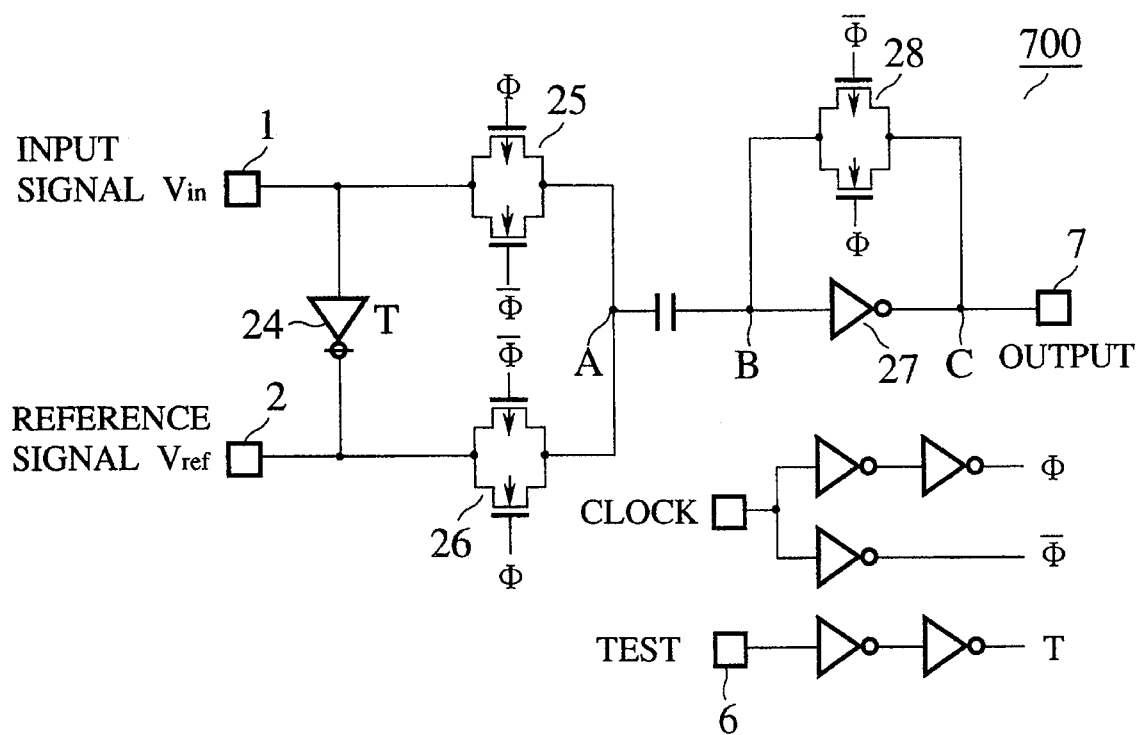
FIG. 13 is a diagram showing a configuration of a comparator circuit of a dynamic type as the seventh embodiment of the present invention.

FIG. 13 is a diagram showing a configuration of the comparator circuit 700 of a dynamic type, namely a chopper type as the embodiment 7.

In the comparator circuit 700 shown in FIG. 13, each of an input terminal 1 and a reference terminal 2 is connected to each of transfer gates 25 and 26, respectively, and a clocked inverter 24 is placed between the input terminal 1 and the reference terminal 2.

At an output terminal 7 side, an inverter 27 and a transfer gate 28 are connected in parallel to the output terminal 7. Thus, in the embodiment 7, the present invention is applied to a comparator circuit of a dynamic type, not applied to a comparator circuit of a static type such as the comparator circuits 100 to 600 the embodiments 1 to 6.

Next, the operation of the comparator circuit 700 of the embodiment 7 will be explained.

Figure 14:
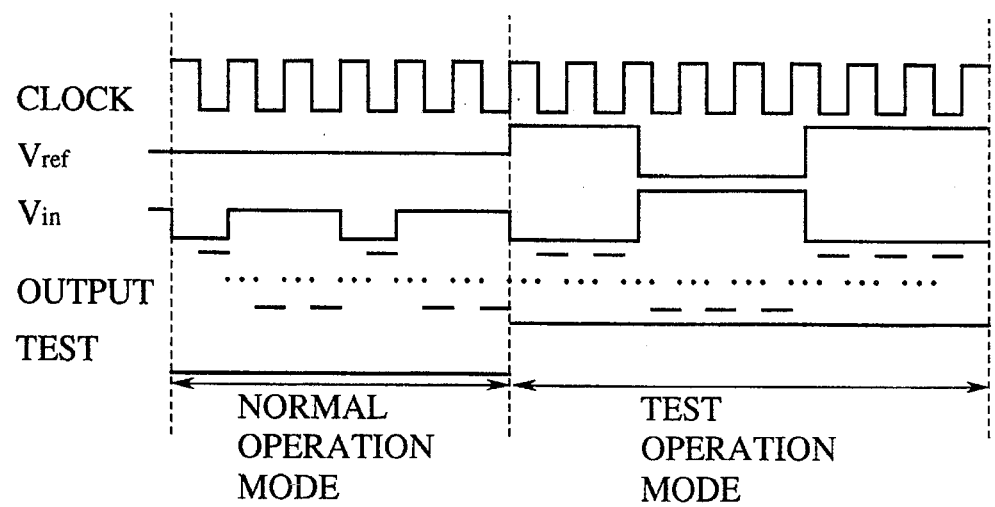
FIG. 14 is a timing chart showing an operation of the comparator circuit of the seventh embodiment as shown in FIG. 13.

FIG. 14 is a timing chart explaining the operation of the comparator circuit 700 of the embodiment 7 as shown in FIG. 13.

In a normal operation mode of the comparator circuit 700, an input signal of a voltage Vin is transmitted to the comparator circuit 700 through the input terminal 1 and a reference signal of a voltage Vref is transmitted to the comparator circuit 700 through the reference terminal 2.

On the other hand, in a test operation mode such as a burn-in test operation mode of the comparator circuit 700, a test signal TEST is transmitted to the comparator circuit 700 through the test terminal 6. Thereby, the clocked inverter 24 becomes ON. The inverted input signal /Vin inverted by the clocked inverter 24 is provided to the reference terminal 6. At this time, the reference terminal is in a open stare, namely no signal such as the reference signal is transmitted to the reference terminal 6. Accordingly, during the test operation mode, when the input signal of the voltage Vin transmitted to the input terminal 1 is compared with the inverted signal of the voltage /Vin in order to operate the comparator circuit 700.

The following TABLE 1 is a relationship between voltages at each of nodes A, B and C in the comparator circuit as shown in FIG. 13.

TABLE 1

| NORMAL OPERATION MODE | | |
| --- | --- | --- |
| Φ | High level | Low level |
| A | Vthinv | Vin |
| B | Vthinv | Vthinv + Vin − Vref |
| C | Vthinv | Vthinv − G(Vin − Vref) |
| TEST OPERATION MODE | | |
| Φ | High level | Low level |
| A | −Vin | Vin |
| B | Vthinv | Vthinv + 2Vin |
| C | Vthinv | Vthinv − 2G × Vin |

Where, a reference character Vref designates a voltage of the reference signal, Vin denotes a voltage of the input signal, Vthinv designates a threshold voltage of the clocked inverter 24, and G denotes a gain of the inverter 27.

Thus, the comparator circuit 700 of the embodiment 7 in which the present invention is applied to a comparator circuit of a dynamic type can be performed under two signal levels.

Embodiment 8

Next, the comparator circuit 800 of the eighth embodiment (embodiment 8) of the present invention will be explained.

Figure 15:
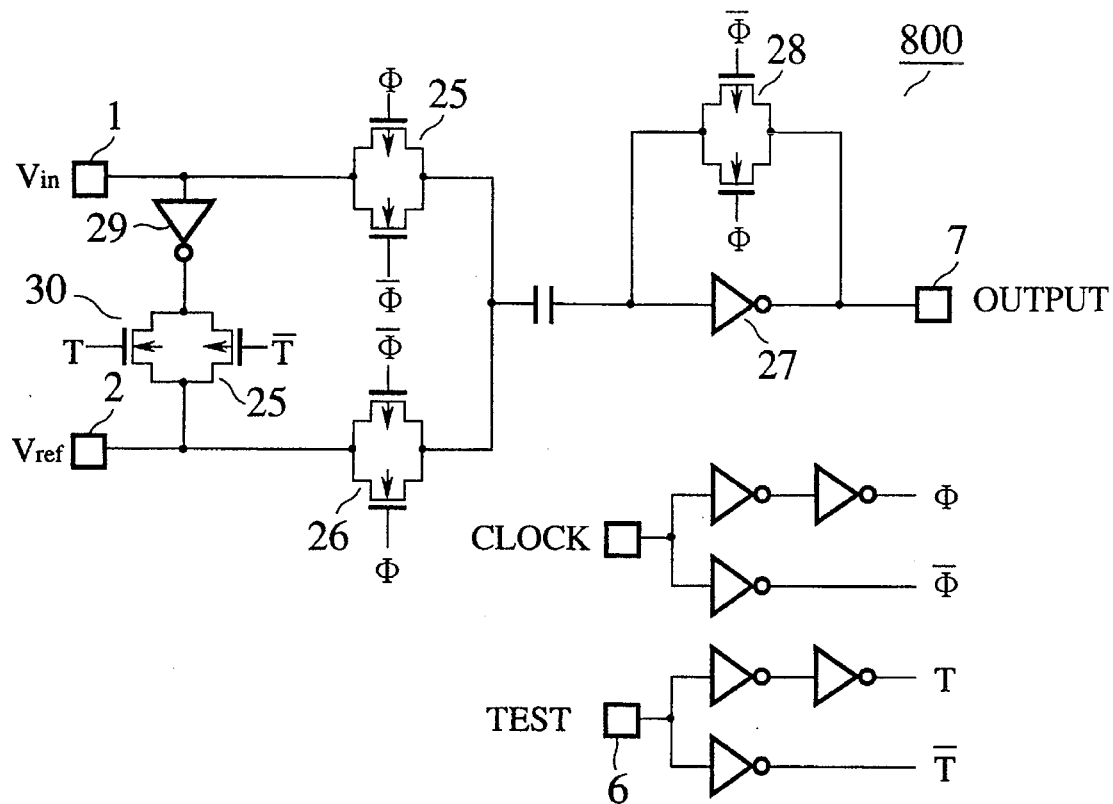
FIG. 15 is a diagram showing a configuration of a comparator circuit of a dynamic type as the eighth embodiment of the present invention.

FIG. 15 is a diagram showing a configuration of the comparator circuit 800 of a dynamic type, namely a chopper type as the embodiment 8.

In the comparator circuit 700 shown in FIG. 13, an inverter 29 and a transfer gate 30 are incorporated between the input terminal 1 and the reference terminals instead of the clocked inverter 24 in the comparator circuit 700 of the embodiment 7 as shown in FIG. 13. Other components are same as those of the comparator circuit 700 of the embodiment 7 as shown in FIG. 13, therefore the explanations about other components are omitted here for brief explanation.

Thus, the inverter 29 and the transfer gate 30 are connected in series and both ends are connected to the input terminal 1 and the reference terminal 2, respectively. The comparator circuit 800 of the embodiment can perform and have the effect similarly to the comparator circuit 700 of the embodiment 7.

Embodiment 9

Next, the comparator circuit 900 of the ninth embodiment (embodiment 9) of the present invention will be explained.

Figure 16:
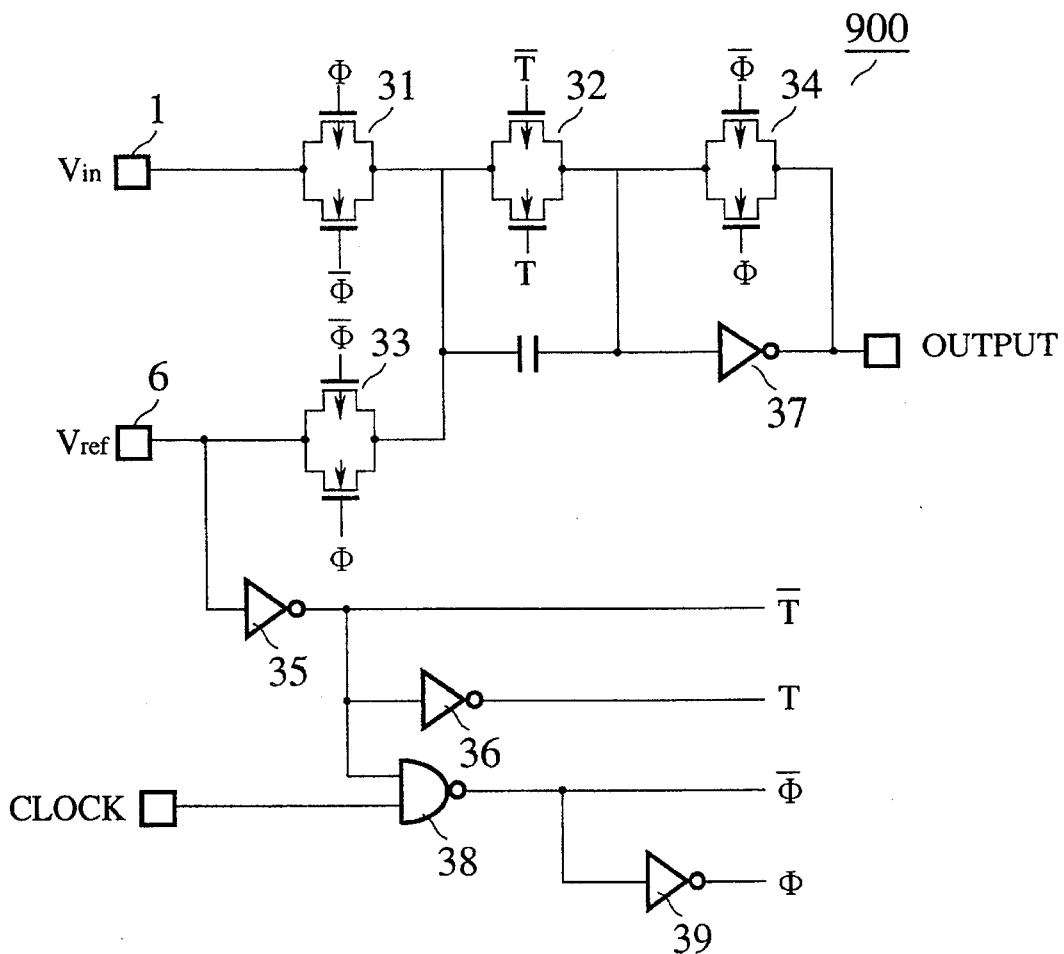
FIG. 16 is a diagram showing a configuration of a comparator circuit of a dynamic type as the ninth embodiment of the present invention.

FIG. 16 is a diagram showing a configuration of the comparator circuit 900 of a dynamic type, namely a chopper type as the embodiment 9.

In the comparator circuit 900 shown in FIG. 16, test signals T and /T (which are equal to the selection signals T and /T used in the circuit 100 to 600 of the embodiments 1 to 6) are generated based on a magnitude of a voltage of the reference signal provided to the reference terminal 2. For example, when the magnitude of the voltage Vref of the reference signal is 5.3 volts, the comparator circuit 900 enters the test operation mode and generates the test signals T and /T in the inside of the comparator circuit 900 itself, and when the magnitude of the voltage Vref of the reference signal is not 5.3 volts, the comparator circuit 900 enters the normal operation mode in which no test signal is generated. These test signal generation operations are performed by inverters 35 as shown in FIG. 16. Moreover, the circuit 900 has transfer gates 31 and 32 which are on in the test operation mode, transfer gates 33 and 34 which are OFF in the test operation mode, and a NAND gate 38 and an inverter 39 by which switch control signals Φ and /Φ are generated.

Thus, the comparator circuit 900 of the embodiment 9 can check whether or not it is the test operation mode corresponding to the magnitude of the voltage Vref of the reference signal. In the test operation mode, the test signals T and /T are generated in the inside of the comparator circuit 900 itself.

Next, the operation of the comparator circuit 900 of the embodiment 9 will be explained.

Figure 17:
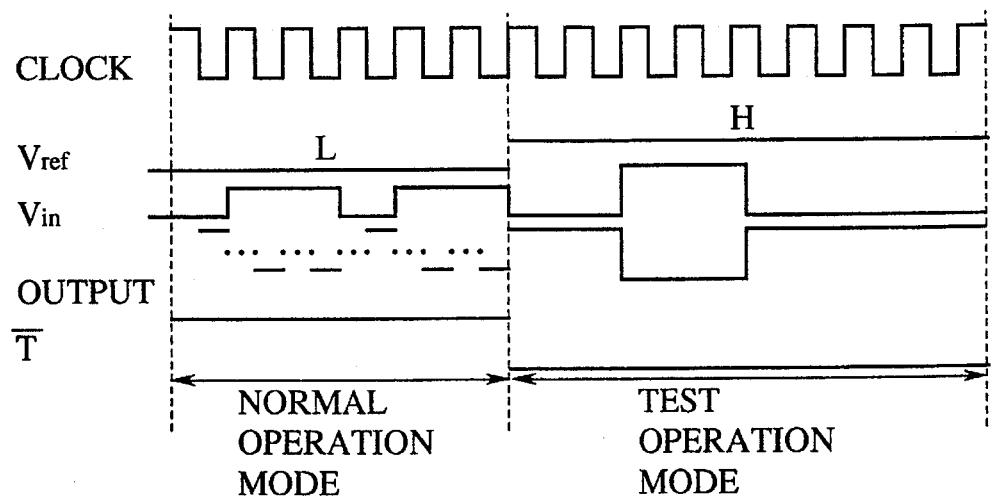
FIG. 17 is a flow chart showing the operation of the comparator circuit of the ninth embodiment as shown in FIG. 16.

FIG. 17 is a timing chart explaining the operation of the comparator circuit 900 of the embodiment 9 as shown in FIG. 16.

In the comparator circuit 900, the test signals T and /T are generated inside of the comparator circuit 900 itself, not provided from outside of the comparator circuit 900. Specifically, during the test operation mode, the test signals T and /T are generated by the inverters 35 and 36 according to the magnitude (or a high level) of the voltage Vref of the reference signal which is provided through the reference signal terminal 2. Then, the switch control signals Φ and /Φ used for the switching operation of the transfer gates 31 and 34 are generated by the NAND gate 38 and the inverter 39 by using the generated test signals T and /T. During the test operation mode, the transfer gates 31 and 32 are ON continuously, and the transfer gates 34 and 35 are OFF. Accordingly, during the test operation mode, the comparison operation between the input signal and the reference signal is not performed, and the voltage Vin of the input signal is directly provided to the inverter circuit 37. Thus, during the test operation mode, the circuit 900 can be performed by two signal levels. In this case, the threshold voltage level of the inverter 35 must be adjusted so that the inverter circuit 35 does not operate (namely, in order to avoid that the inverter circuit 35 responses the level of the voltage Vref of the reference signal as the high level) by the level of the voltage Vref of the reference signal provided to the reference terminal or the test terminal 6 during the normal operation mode.

Thus, the comparator circuit 900 of the embodiment 9 can perform the test operation by using two signal levels, because the comparator circuit 900 can generate the two signal levels inside of the circuit 900 itself.

Embodiment 10

Next, the comparator circuit 1000 of the tenth embodiment (embodiment 10) of the present invention will be explained.

Figure 18:
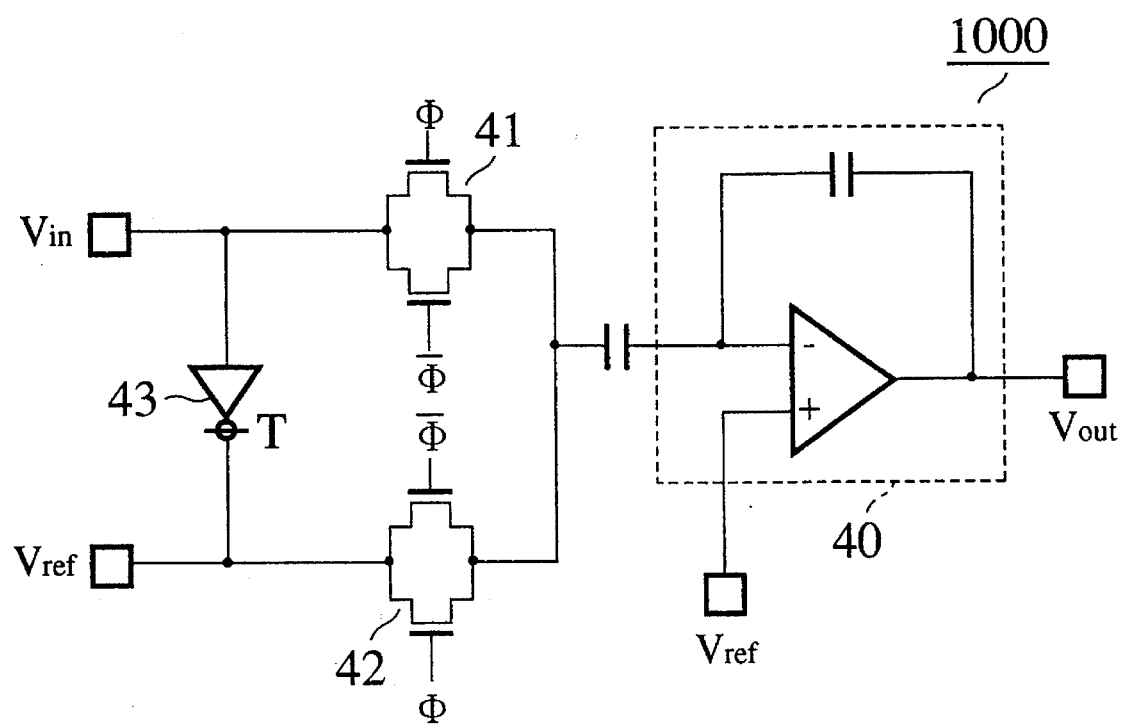
FIG. 18 is a diagram showing a configuration of a comparator circuit of an amplifier type as the tenth embodiment of the present invention.
Figure 19:
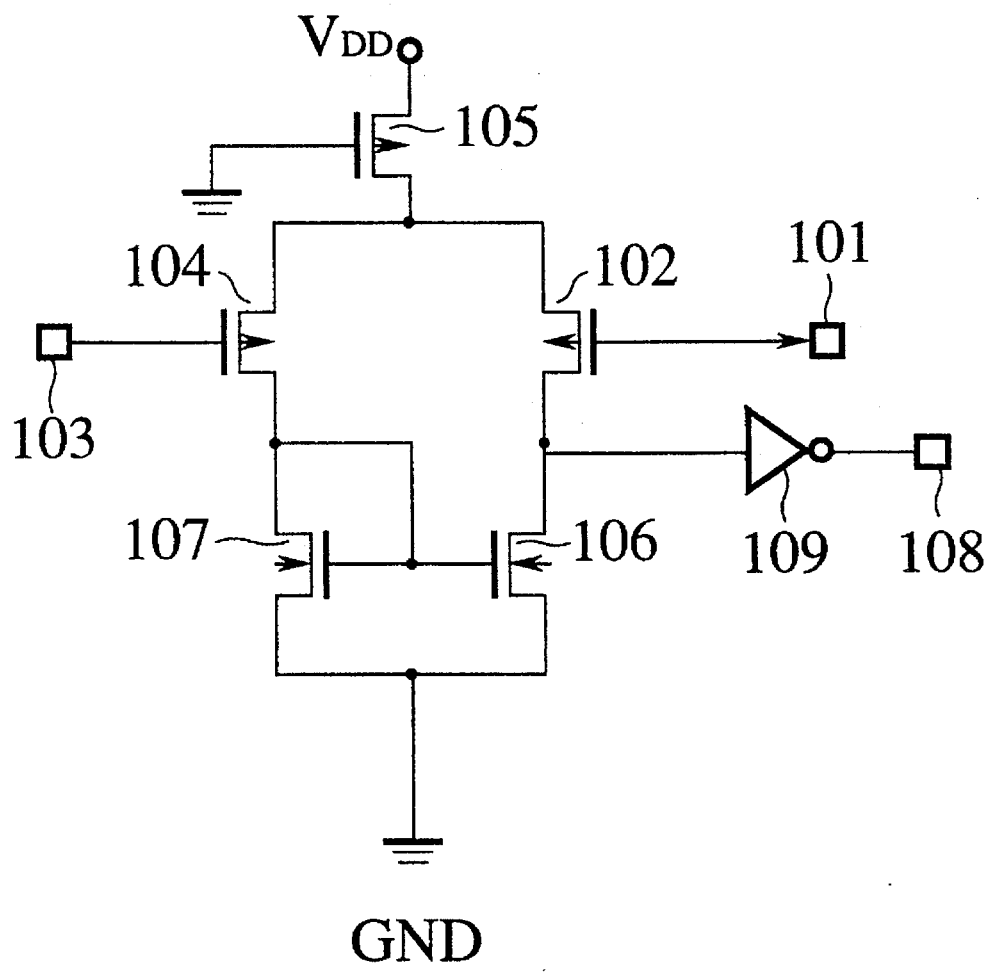
FIG. 19 is a diagram showing a configuration of a conventional comparator circuit of a static type.
Figure 20:
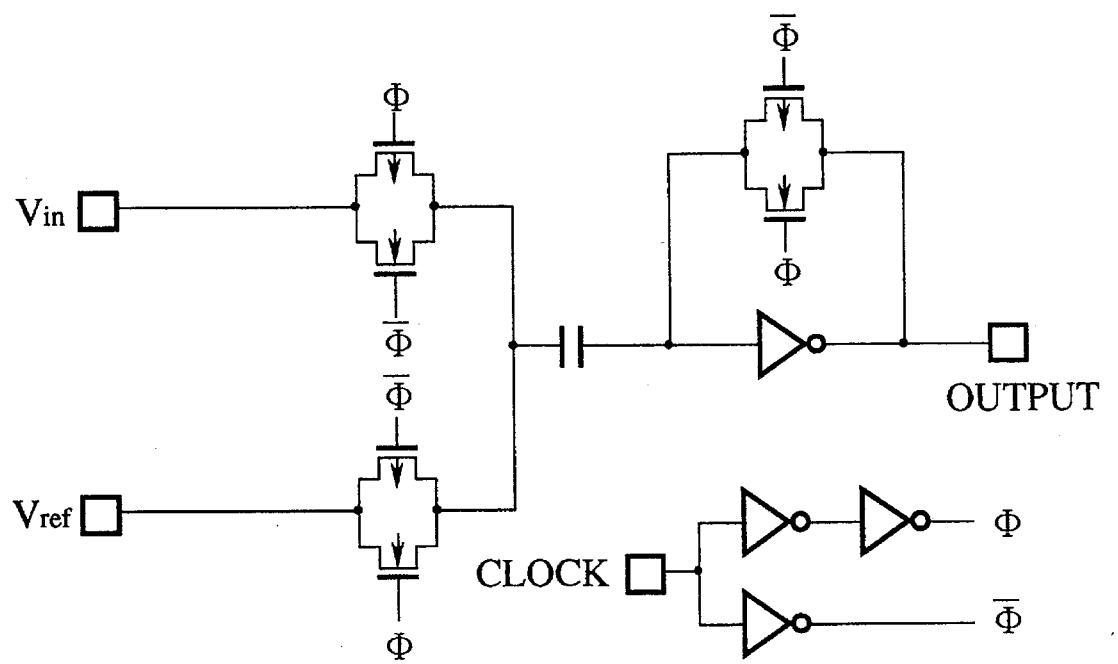
FIG. 20 is a diagram showing a configuration of a conventional comparator circuit of a dynamic type.
Figure 21:
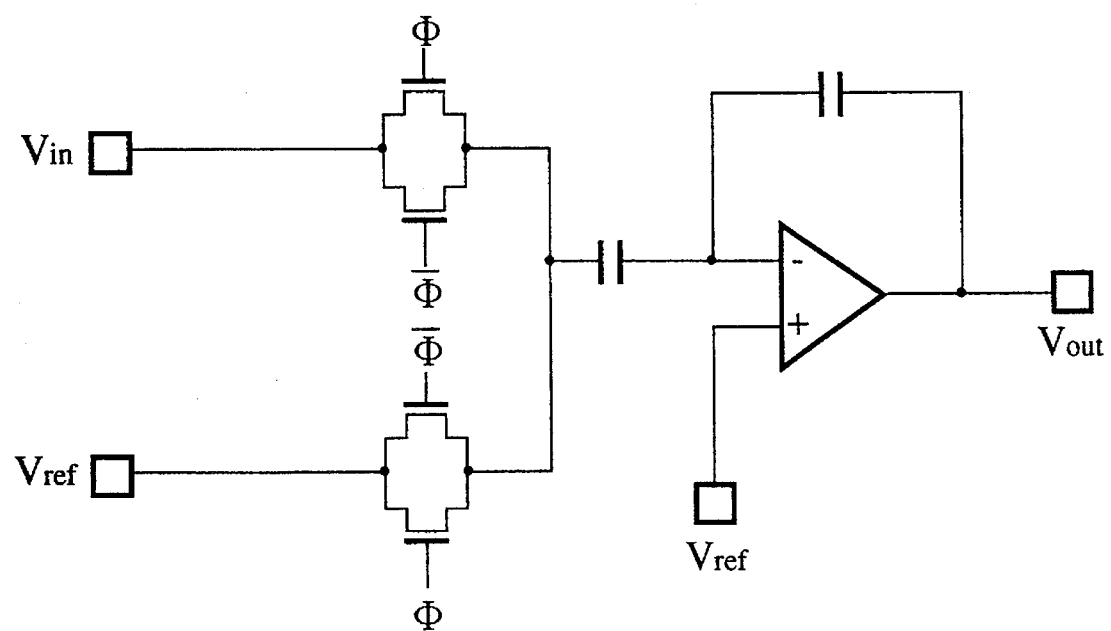
FIG. 21 is a diagram showing a configuration of a conventional comparator circuit of an amplifier type.

FIG. 18 is a diagram showing a configuration of the circuit 1000 of an amplifier type. The embodiment 10 shows an example that the present invention is applied to a circuit of an amplifier type.

In the circuit 1000 shown in FIG. 18, a reference number 40 designates an amplifier, 41 and 42 designate transfer gates, and 43 denotes an inverter. The configuration of these transfer gates 41 and 42, and the inverter 43 is same as that of the comparator circuit 700 of the dynamic type, namely the chopper type, of the embodiment 7 as shown in FIG. 13.

Thus, the present invention can be applicable to comparator circuits of many kinds of types, a static type, a dynamic type, an amplifier type, and so on.

As described above, in the comparator circuit according to the present invention, because the input signal is given to both input terminals of a comparator section and the input signal is transmitted to the output terminal of the comparator section, the burn-in-test operation can be performed by using only the signal having two levels such as the high level and the low level. Thereby, the comparator circuit requiring the reference signal during the normal operation mode can be simply and easily tested without using any exclusive test board. Accordingly, it can be eliminated to make the exclusive burn-in-test board and to use the time to make it and it takes no costs to make the exclusive burn-in-test board.

In addition, in the present invention, because the burn-in-test operation for the comparator circuit is performed under the condition that the input signal is transmitted to one input terminal of the comparator section and inverted input signal which is made by inverting the input signal in phase is given to other input terminal of the comparator section, the same effect of the comparator circuit described above can be obtained. In addition, because it can be achieved to adjust the fluctuation of the threshold voltages of the FETs forming the input side stage of the comparator section, the change of the characteristics of the comparator section after the burn- in-test operation is completed can be reduced.

Furthermore, because the comparator circuit of the present invention can provide one of an input signal or a comparison result between the level of an input signal and the level of a reference signal based on the level of the reference signal, there is the effect that any test mode terminal used for switching the normal operation mode and the test mode of the comparator circuit is not required.

Although the present invention has been described and illustrated in detail, it is clearly understood that the same is by way of illustration and example only and is not to be taken by way of limitation, the spirit and scope of the present invention being limited only by the term of the appended claims.

What is claimed is:

1. A comparator circuit comprising:

a selection circuit for receiving an input signal, a reference signal, and a selection signal, for generating an inverted input signal which is made by inverting the input signal, for selecting the reference signal during a normal operation mode and selecting the inverted input signal during a test operation mode according to a level of the selection signal; and a comparator section for receiving the reference signal or the inverted input signal selected by the selection circuit and for receiving the input signal, for comparing the selected signal and the received signal, and for transmitting a comparison result to outside of the comparator circuit.

2. A comparator circuit as claimed in claim 1 further comprises a selection signal generation circuit for receiving the reference signal during the normal operation mode and for generating the selection signal indicating that the selection circuit selects the reference signal, and for receiving a test signal of a high level or a low level during the test operation mode and for generating the selection signal indicating that the selection circuit selects the inverted input signal.

3. A comparator circuit comprising:

a first selection circuit for receiving an input signal, a reference signal, and a selection signal, for selecting the reference signal during a normal operation mode, and for selecting the input signal during a test operation mode according to a level of the selection signal;

a comparator section for receiving the input signal and the input signal or the reference signal selected by the first selection circuit, for comparing the received input signal and the selected signal, and for transmitting a comparison result; and a second selection circuit for receiving the comparison result from the comparator section and the input signal, and for selecting the comparison result during the normal operation mode and for selecting the input signal during the test operation mode according to the level of the selection signal.

4. A comparator circuit as claimed in claim 3 further comprises a selection signal generation circuit for receiving the reference signal during the normal operation mode and for generating the selection signal indicating that the second selection circuit selects the reference signal, and for receiving a test signal of a high level or a low level during the test operation mode and for generating the selection signal indicating that the second selection circuit selects the input signal.

5. A comparator circuit as claimed in claim 1, wherein the comparator section comprises Field Effect Transistors (FETs) which are connected to each other based on a configuration of a differential amplifier type.

6. A comparator circuit as claimed in claim 3, wherein the comparator section comprises Field Effect Transistors (FETs) which are connected to each other based on a configuration of a differential amplifier type.

7. A comparator circuit as claimed in claim 1, wherein the selection signal is generated at outside of the comparator circuit, the comparator circuit further comprises a test terminal for receiving the selection signal generated at outside of the comparator circuit.

8. A comparator circuit as claimed in claim 3, wherein the selection signal is generated at outside of the comparator circuit, the comparator circuit further comprises a test terminal for receiving the selection signal generated at outside of the comparator circuit.

9. A comparator circuit as claimed in claim 1, wherein the selection circuit comprises a clocked inverter.

10. A comparator circuit as claimed in claim 1, wherein the selection circuit comprises a clocked inverter and a transfer gate.

11. A comparator circuit as claimed in claim 1, wherein the selection circuit comprises a transfer gate and an inverter.

12. A comparator circuit as claimed in claim 3, wherein the first selection circuit comprises a clocked inverter, a transfer gate, and an inverter.

13. A comparator circuit as claimed in claim 3, wherein the first selection circuit comprises a clocked inverter and an inverter.

14. A comparator circuit as claimed in claim 3, wherein the first selection circuit comprises transfer gates and an inverter.

15. A comparator circuit as claimed in claim 3, wherein the second selection circuit comprises clocked inverters and inverters.

16. A comparator circuit as claimed in claim 4, wherein the second selection circuit comprises clocked inverters and inverters.

17. A comparator circuit as claimed in claim 6, wherein the second selection circuit comprises clocked inverters and inverters.

18. A comparator circuit as claimed in claim 3, wherein the second selection circuit comprises a transfer gate, clocked inserters and inverters.

19. A comparator circuit as claimed in claim 4, wherein the second selection circuit comprises a transfer gate, clocked inserters and inverters.

20. A comparator circuit as claimed in claim 6, wherein the second selection circuit comprises a transfer gate, clocked inserters and inverters.

21. A comparator circuit as claimed in claim 1, wherein the comparator section is a comparator section of a chopper type comprising a transfer gate and an inverter which are connected in parallel.

22. A comparator circuit as claimed in claim 1, wherein the comparator section is a comparator section of an amplifier type comprising an amplifier.

23. A comparator circuit comprising:

an input signal terminal for receiving an input signal;

a reference signal terminal for receiving a reference signal; and a comparator section of a chopper type comprising a transfer gate and an inverter which are connected in parallel, for receiving the input signal and the reference signal, based on the level of the reference signal for providing the input signal or for comparing the level of the input signal with the level of the reference signal and providing a comparison result to outside of the comparator circuit.

* * * * *